Oct. 27, 1970 C. B. LEWIS 3,536,966

SEMICONDUCTOR DEVICE HAVING AN ELECTRODE WITH A LATERALLY EXTENDING CHANNEL FORMED THEREIN

Filed Aug. 6, 1968

3,536,966

SEMICONDUCTOR DEVICE HAVING AN ELECTRODE WITH A LATERALLY EXTENDING CHANNEL FORMED THEREIN

Colin Bright Lewis, Nettleham, England, assignor to Associated Electrical Industries Limited, London, England, a British company Filed Aug. 6, 1968, Ser. No. 750,548
Int. Cl. H011 3/00, 5/00
U.S. Cl. 317—234 8 Claims

ABSTRACT OF THE DISCLOSURE

In a semiconductor device including a semiconductor element having a first electrode surrounded by a major surface region which constitutes a second electrode, electrical connection to the first electrode is afforded by a lead passing through a passageway extending laterally through a conductive block which provides a good electrical and thermal connection to the second electrode region. Efficient cooling of the semiconductor element from the side on which the first and second electrodes are formed is thus rendered possible.

This invention relates to semiconductor devices.

The invention relates particularly to semiconductor devices of the kind comprising a semiconductor element having a first electrode region surrounded by a major surface region of the element which constitutes a second electrode region of the element. One example of such a device is a thyristor, the first electrode region then constituting the trigger electrode of the device and the second electrode constituting one of the main electrodes of the device.

In known devices of the kind specified above, connection to the first and second electrode regions are normally made via a pair of coaxial electrodes extending generally perpendicularly away from the second electrode region. Such an arrangement has the disadvantage that heat can be efficiently dissipated only from the major surface of the semiconductor element opposite the second electrode region.

It is an object of the present invention to provide a semiconductor device of the kind specified wherein the above-mentioned disadvantage is overcome.

According to the invention, a semiconductor device comprises a semiconductor element having a first electrode region surrounded by a major surface region of the element which constitutes a second electrode region of the element, eletrical and thermal connection to the second electrode region being afforded by a thermally and electrically conductive member overlying the second electrode region and recessed at the position of the first electrode region, while electrical connection to the first electrode region is afforded by a conductive lead passing through a laterally extending passageway in said member.

Preferably, the conductive member is separate from, rather than affixed to, the semiconductor element, the element and member being in pressure-contact connection. A layer of a noble metal is preferably interposed between the semiconductor element and the conductive member.

In order that the invention may be more clearly understood, some embodiments thereof will now be described, by way of example, with reference to the accompanying drawings in which.

Figure 1:
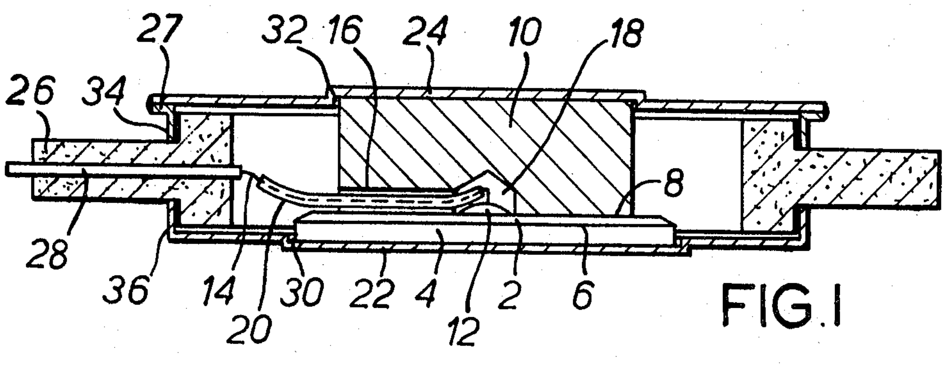
FIG. 1 illustrates diagrammatically in cross section a thyristor in accordance with the invention.

The thyristor shown in FIG. 1 comprises silicon thyristor element 2 in the form of a circular disc mounted on a base 4, preferably of molybdenum or tungsten, which affords electrical and thermal connection to the lower surface 6 of the disc as seen in the drawing. Electrical and thermal connection to a major part of the upper surface 8 of the disc is afforded, with pressure contact thereon, by a conductive member in the form of a block 10 which may be of silver-copper-silver bimetallic construction or of copper with gold layers as described below with reference to FIG. 2.

The thyristor element 2 has a central trigger electrode 12 which is inset in the upper surface 8 of the element, but may protrude, as shown, above the level of that surface.

Electrical connection to the trigger electrode 12 is provided by a lead 14 extending from outside the block 10 to that electrode. To provide a passage for this lead 14, the conductive member is formed with a laterally extending channel or groove 16 facing the upper surface 8 of the element 2. At the position of the trigger electrode 12 the channel 16 enlarges to constitute a recess 18 accommodating a portion of the lead 14 upstanding from the electrode 12. The channel 16 preferably terminates in the recess 18. The lead 14 is provided with an insulating sleeve 20 preventing electrical contact between it and the block 10 and element 2.

A component assembly comprising the parts which have just been described is particularly suited to encapsulation in a disc-like enclosure. Such enclosure may, as shown, include two metallic covers 22 and 24 which are secured to an annular insulating member 26 at axially opposite sides thereof and are so shaped as to locate the assembly in position in the enclosure.

The covers 22 and 24 are preferably of a metal having approximately the same coefficient of expansion as the ceramic ring. Their thickness is suitably about 0.2 millimetre so that by virtue of their resilience the covers 22 and 24 press against the adjacent members of the component assembly and hold the assembly together. In addition, when the device is mounted between two pressure-loaded heat-sinks (not shown), the flexibility of the covers 22 and 24 allows the necessary contact pressure to be established between the conductive block 10 and the semiconductor element 2. The lead 14 to the trigger electrode 12 is brought out laterally from the device by means of a metal tube 28 passing through the ring 26.

In one method of assembling the device, firstly the cover 22 is brazed to a lower part of the ceramic ring 26 and a metal ring 27, to which the upper cover 24 can subsequently be secured as by edge welding, is brazed to an upper part of the ceramic ring. Next, the base 4 carrying the element 2 with the lead 14 connected to the trigger electrode 14 is placed in position in a recess 30 in the cover 22 which serves to locate these parts of the component assembly in position by preventing lateral movement thereof within the enclosure, this recess 30 being defined by an outwardly dished central portion of the cover 22. The conductive block 10 is then placed in position and the cover 24, which has an outwardly dished central portion defining a recess 32 fitting over the block 10, is applied to the latter and welded to the ring 27 to complete the encapsulation and locate the block 10 in position. While the cover 24 is being welded it is pressed towards the ceramic ring 26 so that the covers 22 and 24, being suitably shaped and dimensioned in relation to the thickness of the component assembly, provide by virtue of their resilience the necessary pressure to hold the assembly together.

The metal ring 27, to which the cover 24 is welded, is of flanged form having a cylindrical surface 34 which surrounds and is brazed to an upper cylindrical surface of the ceramic ring 26. The cover 22 is integrally formed with a peripheral cylindrical flange 36 which likewise surrounds and is brazed to a lower cylindrical surface of the ceramic ring 26.

Figure 2:
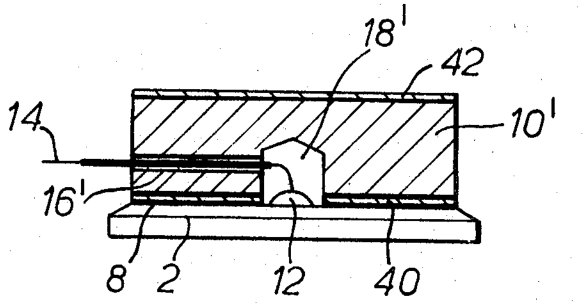
FIG. 2 shows a modification of the thyristor of FIG. 1.

Referring now to FIG. 2, a modification of the thyristor shown in FIG. 1 has a conductive block 10' which, instead of being formed with a channel such as 16, has a hole 16' drilled through it, parallel to its contact surface, to provide a passageway for the lead 14; the hole 16 meets a central recess 18' in the block around the trigger electrode 12. This construction has the advantage that the block 10' provides contact over the whole of the major surface 8 of the element 2.

Although the block 10' may be a bimetallic silver-copper-silver block, it may be preferable to use a copper block with separate gold layers 40 and 42, respectively, over its contact surfaces. The gold layers 40 and 42 may suitably be in the form of foil.

In order to reduce the likelihood of failure due to thermal fatigue, the gold layer 42 between the semiconductor element 2 and the conductive block 10' may be replaced by a molybdenum washer (not shown) sandwiched between two gold layers (not shown). In such an arrangement a molybdenum washer whose surface is first nickel plated and then provided with a fired-in gold evaporated layer may conveniently be used.

The device described with reference to FIG. 2 may be assembled in a similar manner to that described with reference to FIG. 1. In an alternative method, the conductive member 10' is first brazed into the recess 32 in the cover 24, and the semiconductor element 2 with the lead 14 attached is then placed in contact with the member 10', with the lead 14 extending through the channel 16. The base 4 and the cover 22 are then placed in position and the assembly is sealed together in the manner described above. To facilitate this alternative method of assembly it is preferable to invert the components and assemble them the opposite way up to that shown in FIG. 2.

A thyristor having a construction such as that which has been described with reference to FIG. 1 or FIG. 2 has the important advantage over previous designs of thyristor with central trigger electrode that heat can be dissipated efficiently from both major surfaces of the element; in other words, the construction provides for double-sided cooling. In the previous designs, although some heat would be conducted away via the stem of an electrode affording electrical connection to one of the major surfaces of the element, only the base adjacent to the other major surface thereof has been in direct thermal communication with an effective heat-sink; therefore the cooling has been substantially single-sided.

Figure 3:
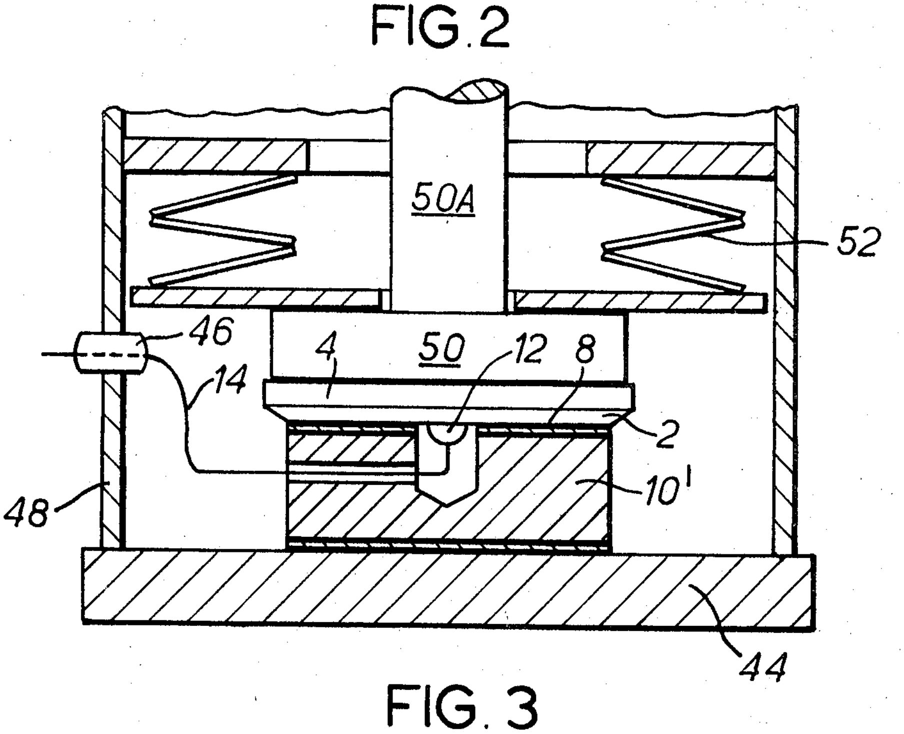
FIG. 3 illustrates another thyristor in accordance with the invention.

The invention also offers an advantage in respect of thyristors with conventional encapsulation arranged for single-sided cooling. In such devices the semiconductor element can normally only be mounted one way up. The use of a conductive block such as 10 or 10', to afford electrical connection to one of the major surfaces of such a thyristor, enables a standard central-trigger semiconductor element to be mounted either way up so as to provide a device of either polarity, as desired. Such a construction as illustrated in FIG. 3 in which a conductive block 10', similar to that of FIG. 2, affords connection between one of the major surfaces of a thyristor element 2 and a base 44 of the device which would be clamped to a heat-sink. A lead 14 to a central trigger electrode 12, which is situated in the lower surface 8 of the element 2 when the element is orientated as shown in the drawing, is led cut through the hole 16' in the block 10' and through an insulator 46 in a wall 48 of the device encapsulation.

Electrical connection to the other major surface (via the base 4 on which the element is mounted) is afforded by a conductive member comprising a disc 50 overlying the base 4 and an integral stem 50A which extends axially away from the element. The disc 50 is held in pressure contact with the base 4 by known means, including a spring arrangement 52, illustrated in simplified manner. The element 2 could equally well be inserted, on assembly of the device, the other way up with its base 4 resting on the base 44 of the device and with the block 10' between it and the disc 50: thus, the polarity of the device can be selected at will when it is assembled, the same kind of element being used in either case.

We claim:

1. A semiconductor device comprising a semiconductor element having a first electrode region which is surrounded by a major surface region of the element which constitutes a second electrode region, a thermally and electrically conductive member which is mounted in good thermal and electrical contact with said second electrode region, said member being recessed where it overlays said first electrode region, and a conductive lead to said first electrode region which passes via a passageway which extends laterally through said conductive member between said recess and a side wall of the conductive member.

2. A device according to claim 1 wherein said passageway is in the form of a hole which passes from said recess to a side wall of the conductive member in a direction parallel to said major surface of the element.

3. A device according to claim 1 wherein said conductive member and said second electrode region are in pressure-contact condition.

4. A device according to claim 3 wherein a layer of a noble metal is interposed between the semiconductor element and said conductive member.

5. A device according to claim 4 wherein a thin planar member of molybdenum having a layer of gold on each main face is interposed between the semiconductor element and said conductive member.

6. A device according to claim 1 wherein the semiconductor elment is mounted with its major surface opposite said second electrode region in electrical and thermal connection with a second thermally and electrically conductive member, the device being adapted to be mounted with either one of said conductive members in good thermal contact with a heat sink.

7. A device according to claim 6 wherein the assembly comprising said semiconductor element and said two conductive members is sandwiched between two metallic planar cover members which are sealed to the opposite ends of an annular memebr of insulating material surrounding said assembly to form a disc-like enclosure.

8. A device according to claim 7 wherein each said conductive member locates in a recess formed in the adjacent cover member.

References Cited

UNITED STATES PATENTS

| | | | |
|---|---|---|---|
| 3,474,303 | 10/1969 | Lutz | 317—235 |
| 3,476,979 | 11/1969 | Stumpe et al. | 317—241 X |

FOREIGN PATENTS

| | | |
|---|---|---|
| 1,234,326 | 2/1967 | France. |
| 1,458,611 | 10/1966 | France. |
| 1,520,554 | 3/1968 | France. |
| 820,320 | 11/1951 | Germany. |
| 1,212,638 | 3/1966 | Germany. |

JOHN W. HUCKERT, Primary Examiner

A. J. JAMES, Assistant Examiner

U.S. Cl. X.R.

317—235